(12) United States Patent
Bauer et al.

(10) Patent No.: US 7,408,241 B2
(45) Date of Patent: *Aug. 5, 2008

(54) SEMICONDUCTOR DEVICE WITH A RECESSED BOND PAD

(75) Inventors: Michael Bauer, Nittendorf (DE); Irmgard Escher-Poeppel, Regensburg (DE); Edward Fuergut, Dasing (DE); Simon Jerebic, Regensburg (DE); Holger Woerner, Regensburg (DE)

(73) Assignee: Infineon Technologies AG, Munich (DE)

( * ) Notice: Subject to any disclaimer, the term of this patent is extended or adjusted under 35 U.S.C. 154(b) by 86 days.

This patent is subject to a terminal disclaimer.

(21) Appl. No.: 11/348,638

(22) Filed: Feb. 7, 2006

(65) Prior Publication Data

US 2006/0192298 A1 Aug. 31, 2006

(30) Foreign Application Priority Data

Feb. 7, 2005 (DE) ........................ 10 2005 005 749

(51) Int. Cl.
  *H01L 29/06* (2006.01)
  *H01L 21/44* (2006.01)
  *H05K 7/10* (2006.01)
(52) U.S. Cl. .................. 257/623; 257/774; 257/786; 257/E23.037; 361/767; 438/612
(58) Field of Classification Search .............. None
  See application file for complete search history.

(56) References Cited

U.S. PATENT DOCUMENTS

| 3,494,803 | A | | 2/1970 | Avis |
| 5,844,782 | A | | 12/1998 | Fukasawa |
| 5,943,597 | A | | 8/1999 | Kleffner et al. |
| 6,125,043 | A | * | 9/2000 | Hauer et al. ................. 361/760 |
| 6,462,415 | B1 | | 10/2002 | Ishiguri et al. |
| 6,806,562 | B2 | * | 10/2004 | Barchmann et al. ......... 257/686 |
| 6,825,541 | B2 | * | 11/2004 | Huang et al. ................. 257/459 |
| 7,271,498 | B2 | * | 9/2007 | Huang ......................... 257/781 |
| 2001/0010408 | A1 | * | 8/2001 | Ker et al. ..................... 257/781 |
| 2002/0016022 | A1 | * | 2/2002 | Shintani ...................... 438/108 |
| 2002/0070423 | A1 | | 6/2002 | Takafuji |

FOREIGN PATENT DOCUMENTS

DE 10352349 6/2005

* cited by examiner

*Primary Examiner*—Alonzo Chambliss
(74) *Attorney, Agent, or Firm*—Dicke, Billig & Czaja PLLC

(57) ABSTRACT

A semiconductor device with surface-mountable outer contacts and to a process for producing it is disclosed. In one embodiment, surface-mountable outer contacts are arranged on outer contact connection surfaces on the underside of the semiconductor device. In their respective center region, the outer contact connection surfaces have at least one recess which has a dovetail-like profile, the areal extent of the recess being smaller than the maximum cross section of an outer contact. In a one process, the recess in the center region is achieved by selective deposition of correspondingly patterned metal layers.

19 Claims, 3 Drawing Sheets

SEMICONDUCTOR DEVICE WITH A RECESSED BOND PAD

CROSS-REFERENCE TO RELATED APPLICATIONS

This Utility Patent Application claims priority to German Patent Application No. DE 10 2005 005 749.7, filed on Feb. 7, 2005, which is incorporated herein by reference.

FIELD OF THE INVENTION

The invention relates to a semiconductor device with surface-mountable outer contacts and to a process for producing it. The surface-mountable outer contacts are arranged on outer contact surfaces on the underside of the semiconductor device.

BACKGROUND

FIG. 3 illustrates a diagrammatic cross section through a prior art surface-mountable outer contact of a semiconductor device of this type. With the aid of this surface-mountable outer contact 1, the semiconductor device is mounted on a higher-level printed circuit board 18. The higher-level printed circuit board 18 has contact connection surfaces 19, which are mounted on the top side 20 of the printed circuit board 18 and in terms of arrangement and size correspond to the arrangement and size of the outer contacts 1 of the surface-mountable semiconductor device 3. The top side 20 of the printed circuit board 18 may have a soldering stop resist layer 17, which only leaves clear a region, in which the outer contact 1 is to be arranged, at the corresponding contact connection surface. The outer contact on the underside 2 of the semiconductor device 3 is also arranged in a very similar way, except that in this case the outer contact connection surface 4 comprises two metal layers 9 and 10, the metal layer 10 being particularly suitable for forming a compound with the solder material of the outer contact 1. Outer contacts 1 of this type have a lead-containing solder material.

However, if the outer contact 1 consists of a lead-free solder material, the problem arises that intermetallic phases 16 are formed in the material of the outer contact 1 in a zone 21, with the result that the material of the outer contact 1 is greatly embrittled. When the outer contacts 1 are being secured to the underside 2 of the semiconductor device 3, as illustrated in FIG. 3, this brittle region is exposed, without any support, to the full stresses caused by shear forces, which occur on account of the differences in the coefficients of thermal expansion of the board part of the printed circuit board 18 and of the semiconductor 3. If these shear stresses get out of hand, there is a risk of the outer contact 1 tearing off from the semiconductor device 3 in the brittle material zone 21.

Furthermore, another surface-mountable outer contact is known from document U.S. Pat. No. 5,844,782. In this case, the external outer contact of the semiconductor device is arranged on an outer contact surface, the areal extent of which is smaller than the contact surface by which the outer contact is fixed to the underside of the semiconductor device. Therefore, the outer contact covers not only the outer contact surface but also the edge sides of the metal layer which has been patterned to form an outer contact surface. In principle, the outer contact surface projects into the solder bead of the external outer contact.

A similar structure for a surface-mountable outer contact is known from document U.S. Pat. No. 5,943,597; in this case, first of all a base of conductive material of smaller area extent is additionally deposited on the outer contact surface, and then a soldering ball which completely surrounds the base is applied to the base, so that the base deposited by electroplating projects into the soldering ball. The known surface-mountable outer contacts have the drawback that the critical transition zone from the outer contact surface or the base deposited by electroplating to the outer contacts referred to above is not supported in any way, and consequently there is a risk that in this relatively brittle transition zone the risk of tearing will increase still further in the event of corresponding thermal stresses and sheer stresses on the outer contact.

Patent application DE 103 52 349 discloses a semiconductor chip with flip chip contacts, and a process for producing it. The flip chip contacts are arranged on contact surfaces which are surrounded by a passivation layer covering the active top side while leaving clear the contact surfaces. For its part, this passivation layer has thickened portions which surround the contact surfaces and have an edge beading of polymeric passivation material which limits the extent to which the solder material of a solder ball can spread over the center region of the contact surface. This soft edge beading, consisting of polymeric passivation material, of the outer contact surface cannot mechanically support the critical and brittle transition zone from the solder ball to the outer contact surface.

However, the demands imposed on surface-mountable outer contacts and their reliability are becoming greater and greater, especially since ball grid array packages (BGAPs) with surface-mountable outer contact surfaces are nowadays being used as soldering contact points for a wide range of applications. Mobile appliances are becoming increasingly important in this context. Manufacturers of these appliances, in addition to the reliability tests that have hitherto being standard, are increasingly requiring evidence of what is known as mechanical shock resistance, also referred to as the drop test. In this context, it has been established that the drop test results of lead-free soldered joins are worse than those of lead-containing solders. The outer contacts break at the thinnest point in the soldered join, namely at the point with the greatest stress.

In the case of lead-free solder, this point is also distinguished by the fact that a brittle intermetallic phase of zone within the outer contact is formed close to the outer contact surface and is unable to withstand the shock-like mechanical stresses. The above solutions increase the risk of fracture in solder balls made from lead-free solders still further, since the outer contact surfaces or a pedestal or base which has been deposited by electroplating projects into the solder ball.

Other forms of solutions have proven either too expensive or not practicable. The especially expensive methods include introducing an underfill material between the outer contact surface and a higher-level circuit substrate on which the semiconductor device is to be surface-mountable, with this underfill material being intended to support the outer contacts in order to ensure that they are not torn off the semiconductor chip. In this case, however, an additional process, which involves using special tools to press an underfill material between the underside of the semiconductor chip and the top side of the higher-level printed circuit board, is required for the surface mounting of the semiconductor devices on a higher-level printed circuit board. An additional problem is the limited and restricted storage time of underfill materials of this type and the often greatly restricted access options for introducing the underfill material on the higher-level printed circuit boards and in the intermediate spaces.

In the case of other surface-mountable semiconductor devices, it is attempted to avoid the drawback by drastically reducing the size of the solder bead, which is associated with a reduction in weight and stress. However, this solution proves to be of only very limited use for industrial manufacture using the ball grid array package process that needs to be employed. Another way of avoiding the difficulties of the outer contacts becoming brittle in a boundary zone consists in using elastic solder beads which in the core consist of plastic and only the shell of which is composed of solderable material. However, elastic beads of this type have not to date found an application suitable for industrial manufacture. Moreover, the options for exchanging and replacing semiconductor devices when using surface mounting with elastic solder beads are extremely limited.

Further developments provide for the formation of what are known as non solder mask defined pads" (NSMDPs), which are intended to reduce the mechanical stress over a relatively large contact surface. The drawback of these NSMDPs of outer contact surfaces is the relatively small change in stress which these outer contacts will tolerate without being damaged. Finally, tests have also been carried out using what are known as "softer" alloys with correspondingly softer intermetallic phases at the boundary layer or boundary zone between outer contact surfaces and outer contacts. However, these tests have not to date managed to achieve a certain standardization of the alloys.

Finally, it is attempted, as mentioned in application DE 103 52 349, to support the at-risk location by means of what is known as a collar reinforcement made from a polymer. However, this solution has the drawback that even relatively minor changes in stress can lead to the supporting function being lost. The proposed solutions listed above are therefore in some cases inadequate for the shock stresses mentioned above, or alternatively too expensive to realize on an industrial scale.

For these and other reasons, there is a need for the present invention.

SUMMARY

The present invention provides a semiconductor device with surface-mountable outer contacts and method of making the semiconductor device. In one embodiment, the surface-mountable outer contacts are arranged on outer contact connection surfaces on the underside of the semiconductor device, and the outer contact connection surfaces having in their respective center region at least one recess which comprises a dovetail-like profile, with the areal extent of the recess being smaller than the maximum cross section of an outer contact.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
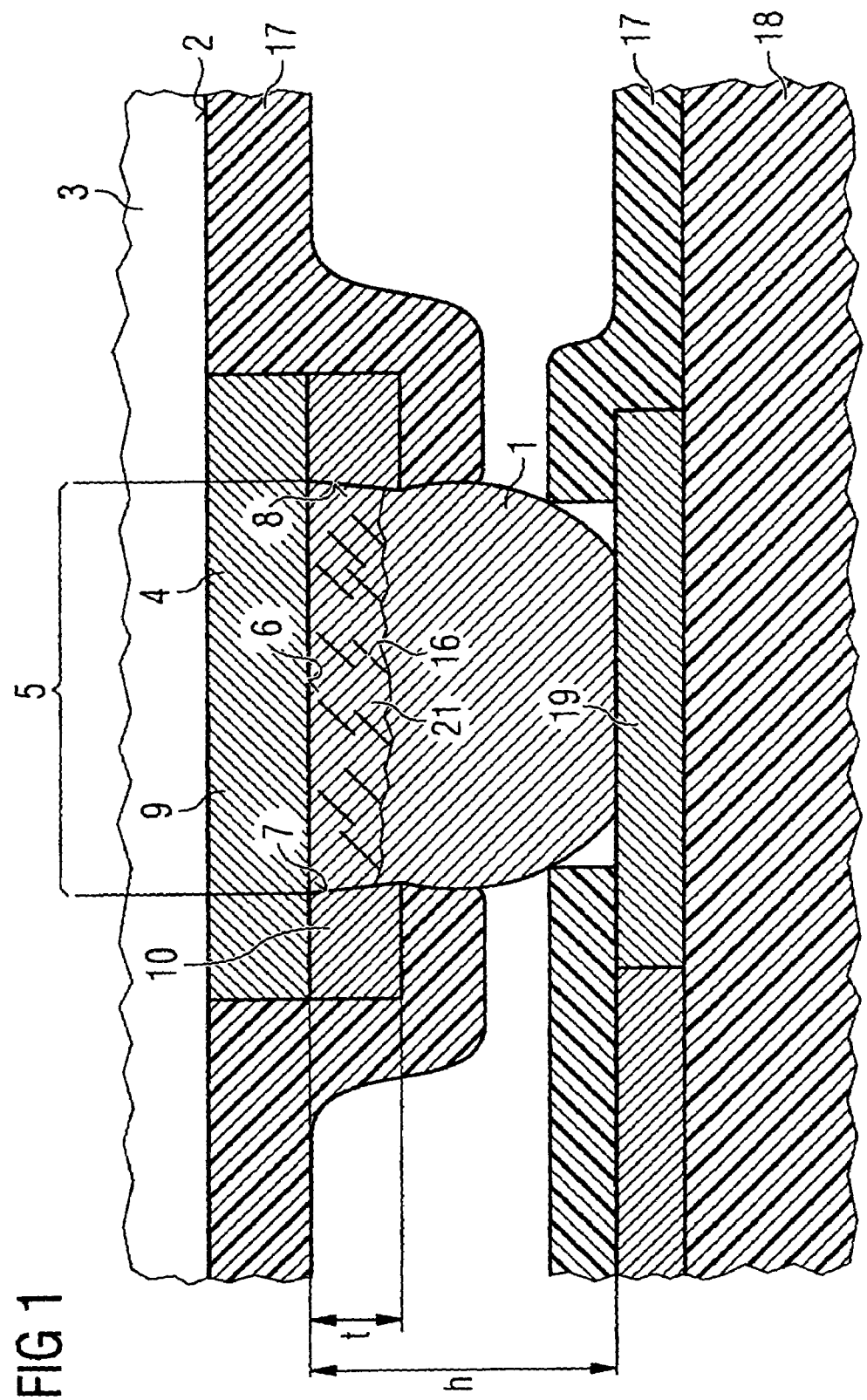
FIG. 1 illustrates a diagrammatic cross section through a surface mountable outer contact of a semiconductor device in accordance with a first embodiment of the invention.

In the following Detailed Description, reference is made to the accompanying drawings, which form a part hereof, and in which is illustrated by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a semiconductor device with surface-mountable outer contacts which is inexpensive to produce, the surface-mountable outer contacts being arranged on outer contact surfaces on the underside of the semiconductor device. It is intended in particular to realize outer contacts using lead-free solders, which are known to be brittle in their transition zone from the outer contact surface to the lead-free solder and accordingly form brittle intermetallic phases. Therefore, the present invention, despite these brittle phases, makes available an outer contact with an outer contact surface which is reliably able to withstand even high stresses under fluctuating thermal conditions and shock loads.

In one embodiment, the invention provides a semiconductor device having surface-mountable outer contacts, the surface-mountable outer contacts being arranged on outer contact surfaces on the underside of the semiconductor device. In their respective central region, the outer contact surfaces have at least one recess which has a dovetail-like profile, with the areal extent of the recess being smaller than the maximum cross section of the outer contacts.

This solution has the advantage that the material of the outer contact, in particular in the brittle transition zone from the outer contact surface material to the outer contact material, is arranged in the recess and is therefore provided with lateral mechanical support which is made available by the dovetail-like formation in the center region of the outer contact surface. Therefore, the outer contact, in its critical brittle region, is fundamentally clamped in the outer contact surface on the underside of the semiconductor chip, so that only the ductile or at least elastic region of the outer contact projects out of the outer contact surface. This region is therefore able to follow the corresponding thermal expansions and absorb or attenuate sheer stresses without being torn off.

The anchoring of the outer contacts in the outer contact surfaces on the underside of a semiconductor device in accordance with the invention clearly distinguishes this solution to the problem from the prior art as disclosed by documents U.S. Pat. No. 5,943,597 and U.S. Pat. No. 5,844,782. Instead of making the soldering ball extend beyond the edges of the contact connection surface or of a metallic base, in the solution according to the invention the outer contact, in its brittle region, is forced into a recess in the central region of the contact connection surface.

In a further embodiment of the invention, the recess in the outer contact surface has a circular edge. A circular edge of this type is advantageous in particular for solder beads, since the circular edge is matched to a cross-sectional area of the bead.

In another embodiment of the invention, the recess in the outer contact surface has an oval edge which can be matched to a rectangular outer contact surface. Furthermore, the recess in the central region of the outer contact surface may have a square edge or a rectangular edge or alternatively a polygonal edge, depending on the structure of the outer contact. Edge variants of this type are particularly suitable for outer contacts in column form.

In a further embodiment of the invention, the outer contact connection surface has a plurality of recesses with dovetail-like profile, with the sum of the base areas of the recesses of an outer contact connection surface being smaller than the maximum cross-sectional area of the outer contact. In this embodiment of the invention, a plurality of anchoring points are provided for the outer contact, specifically wherever a recess is provided. This has the advantage of minimizing delamination of the outer contact from the surface of the recess.

Furthermore, it is provided that the recess has a depth t which is less than half the height h of the outer contact, with a range $h/10 \leqq t < h/2$. The depth t is such that the brittle boundary zone with corresponding intermetallic phases can be accommodated entirely within the recess in the outer contact surface. This has the advantageous result that only ductile or elastic material projects above the contact connection surface.

Furthermore, one embodiment of the invention has an outer contact surface which is composed of two metal layers, the first metal layer including a first metal, and a second metal layer, which includes a second metal, being arranged on the first metal layer, the recess being arranged in the second metal layer. This structure of the outer contact connection surface has the advantage that a dovetail contour for the recess in the outer contact surface can be realized in a way which is simple in terms of the manufacturing technology. For this purpose, a base of photoresist, which is smaller than the surface area of the outer contact surface, is applied to the first metal layer, and then a second metal is applied and then forms the dovetail contour around the applied base of photoresist. Then, the base made from photoresist can be removed from the center region of the contact connection surface in the second metal layer, resulting in perfect anchoring of the critical zone of the outer contact in the second metal layer.

Furthermore, it is provided that the outer contact connection surfaces are arranged on a wiring structure of a wiring substrate, the wiring substrate having a semiconductor chip which is connected to the outer contact connection surfaces via connecting elements and is surrounded by a housing. With these components, it is possible to produce a complete semiconductor device, which is distinguished from the prior art by virtue of the fact that the outer contact connection surfaces in their center region now have a dovetail-like recess, in which an outer contact surface, in particular of a lead-free solder material, can be arranged without the critical zone studded with intermetallic phases being exposed to shear stresses.

A process for producing a semiconductor device with surface-mountable outer contacts includes the following process.

A wiring substrate having a wiring structure, which is intended to have outer contact connection surfaces for the semiconductor device with surface-mountable outer contacts, is produced. This is followed by patterned deposition of a metal layer on the outer contact connection surfaces, in such a manner that the outer contact connection surfaces in their respective center region have at least one recess with a dovetail-like profile. The areal extent of the recess is smaller than the maximum cross section of an outer contact.

To complete the semiconductor device, it is possible to apply a semiconductor chip to the wiring substrate, with the semiconductor chip being connected to the wiring substrate via connection elements, so that the outer contact connection surfaces are electrically connected to the semiconductor chip. To provide these components with a housing, the wiring substrate together with the semiconductor chip and the connection elements are introduced into a housing, in such a manner that the outer contact surfaces on the underside of the semiconductor device remain freely accessible. Then, outer contacts can be attached to the specially patterned outer contact surfaces, with the outer contacts being anchored in the recesses in the outer contact surfaces. During this process, the metal layers, which are in this case deposited on top of one another, need not necessarily consist of different metals. Rather, it is also possible for the patterned dovetail-like coating to be arranged on a base metal layer in the center region of the prepared contact connection surfaces.

In a further embodiment of the invention, an Ni/Au metal layer is applied selectively to the outer contact connection surfaces with their recesses in the center prior to the application of the outer contacts, with the recess being formed in the center regions of the outer contact connection surfaces. This Ni/Au metal layer can be made extremely thin, with a thickness of a few 10s of nm, by means of a sputtering process, so that the entire contact connection surface has a coating on which a solder ball can be fixed. On the other hand, it is also possible for the Ni/Au metal layer to be applied in patterned form, in such a manner that it is only this layer which creates the recesses on the contact connection surfaces.

In another implementation example of the process, prior to the application of the outer contacts a copper layer is applied selectively to the outer contact connection surfaces, with the recess being formed in the center regions of the outer contact connection surfaces. A copper layer of this type is known to be somewhat harder than an aluminum layer or an Ni/Au layer as contact layer for the outer contacts. This has the advantage that the copper layer effects secure anchoring of the outer contact.

In a further execution example of the process, a soldering stop resist layer is applied selectively to the underside of the semiconductor device, leaving clear the outer contact connection surfaces, prior to the application of the outer contacts. A solder stop layer of this type limits the contact-making region of the outer contact to the recesses provided in the outer contact connection surfaces and ensures that outer contact material does not spread out in an uncontrolled way over the top side of the semiconductor chip.

Furthermore, it is provided that the solder beads of a lead-free solder material are soldered onto the outer contact connection surfaces. This lead-free solder material has the advantage that the outer contacts no longer contain any lead and are therefore more environmentally compatible than the outer contacts used in the prior art.

To summarize, it can be stated that invention consists in a modified outer contact surface geometry. This modified outer contact surface geometry means that the mechanical stress is maximized at a location comprising a stable metal alloy, such as copper or Ni/Au. The region or zone of the outer contact comprising the brittle intermetallic phases is therefore protected from premature failure by the special structure of the outer contact surface.

Figure 3:
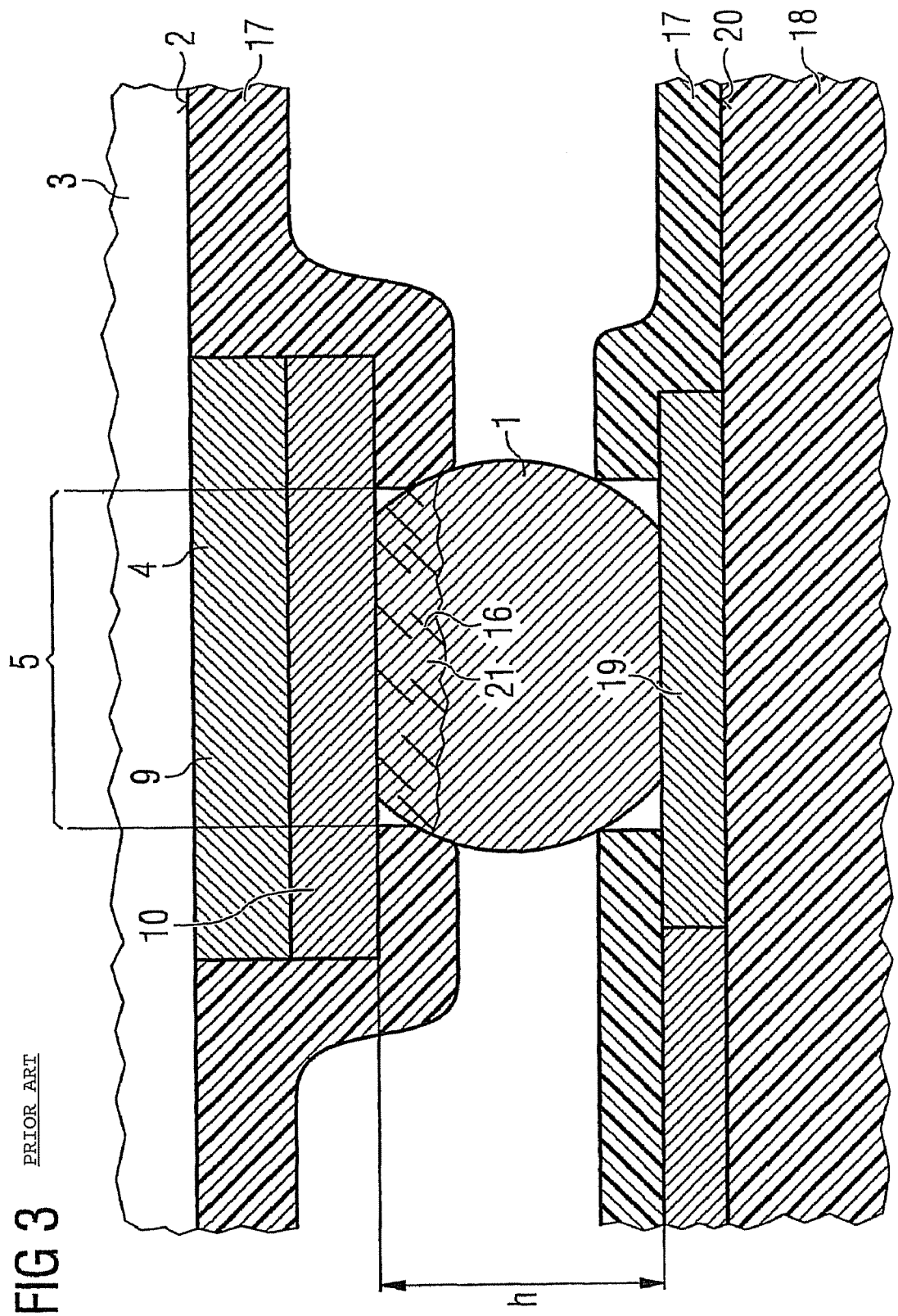
FIG. 3 illustrates a diagrammatic cross section through a surface mountable outer contact of a semiconductor device in accordance with the prior art.

FIG. 1 illustrates a diagrammatic cross section through a surface-mountable outer contact 1 of a semiconductor device 3 in accordance with a first embodiment of the invention. Components having the same functions as in FIG. 3, which was explained above, are denoted by the same reference designations and are not explained again. In this case too, a brittle material region has formed in the solder material of the outer contact 1 in a boundary zone 21; this brittle region includes sporadic intermetallic phases 16.

In this case, the second metal layer 10 has been patterned in such a manner that a recess 6 is formed in the central region 5 of the outer contact surface 4; this recess 6 has a wedge-shaped profile 7 and its depth t is such that the entire region comprising intermetallic phases 16 can be accommodated within the recess 6. The dovetail-like contour of the outer contact connection surface 4 supports this critical zone 21 of the outer contact 1, so that only material of the outer contact 1 which is ductile or elastically deformable projects above the recess 6. A soldering stop resist layer 17 is arranged on the underside 2 of the semiconductor chip 3, in such a manner that the edges of the outer contact connection surface 4 are covered by this soldering stop resist layer 17 and only the region on the outer contact connection surface 4 which is to be coated with an outer contact material is left clear.

Figure 2:
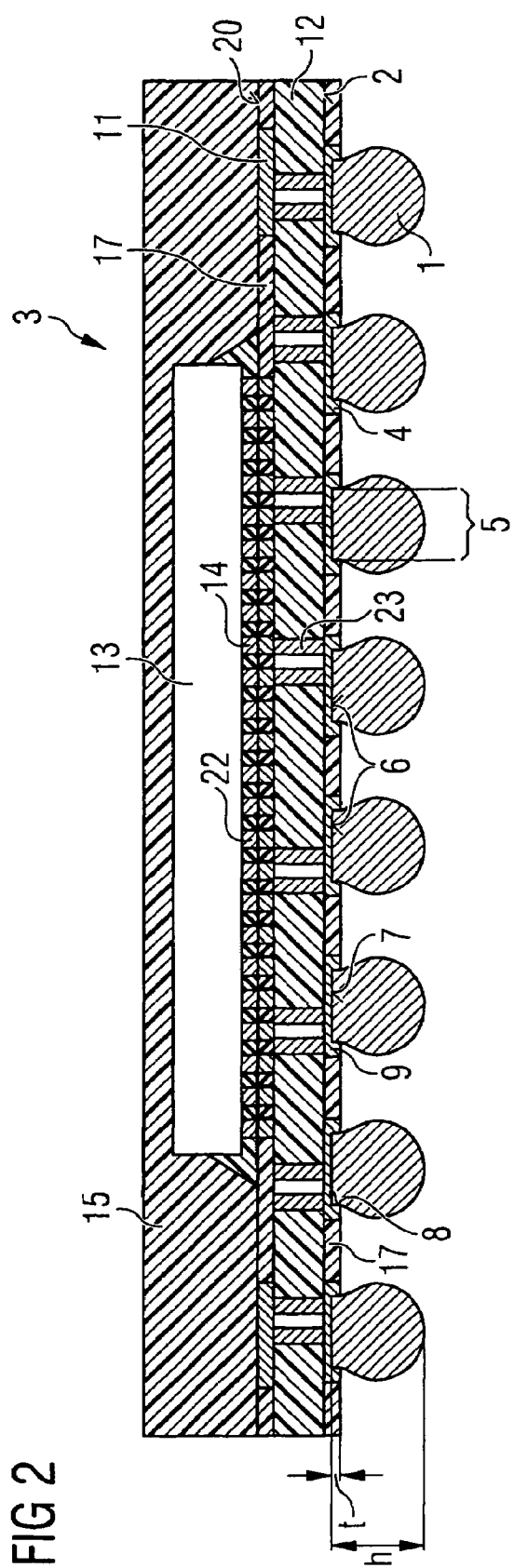
FIG. 2 illustrates a diagrammatic cross section through a semiconductor device having surface-mountable outer contacts in accordance with a second embodiment of the invention.

FIG. 2 illustrates a diagrammatic cross section through a semiconductor device 3 having surface-mountable outer contacts 1 in accordance with a second embodiment of the invention. Components having the same functions as in the previous figures are denoted by the same reference designations and are not explained again.

The outer contact surfaces 1, which have a profile 7 with edge regions 8 that are in dovetail form, this time are not accommodated in a soft metal layer, but rather are directly recessed into this outer contact connection surface 4 formed from the first metal layer 9. This can be done by plasma etching or by wet etching and/or by laser ablation. Each of these recesses 6 carries an outer contact 1, with the depth t of the recess 6 being selected in such a way that least the entire zone 21 in which intermetallic phases 16 occur is clamped in recess 6.

The further structure of the semiconductor device 3 substantially includes a semiconductor chip 13, which as connecting elements 14 has flip chip contacts 22, that are a least one order of magnitude smaller than the outer contacts 1 and are arranged on a wiring structure 11 with the aid of a wiring substrate 12. The wiring substrate 12 also has through-contacts 23, via which the outer contacts 1 are electrically connected to the flip chip contacts 22 of the semiconductor chip 13. The semiconductor chip 13 with its flip chip contacts 22 on the top side 20 of the wiring substrate 12 is embedded in a housing 15 of a plastic compound.

Not only does the underside 2 of the semiconductor device 3 have a soldering stop resist layer 17, but also the top side 20 of the printed circuit board 18 is equipped with a soldering stop resist layer 17, in order to allow defined application of the chip contacts 22 of the semiconductor device 3 to corresponding contact connections of the wiring substrate 12. As a result of the outer contacts 1 being clamped in the recesses 6 in the center region 5 of the outer contact surfaces 4, the outer contacts 1 are reliably fixed and anchored in such a way that they can absorb high sheer stresses, especially since their brittle zones 21, in the transition region from outer contact connection surfaces 4 to outer contacts 1, are anchored by the edges 8 of the recesses 6.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising:
   a semiconductor device with surface-mountable outer contacts, the surface-mountable outer contacts being arranged on outer contact connection surfaces on an underside of the semiconductor device,
   the outer contact connection surfaces having in their respective center region at least one recess which comprises a dovetail-like profile, wherein the recess defines a depth dimension with first and second ends at opposite ends of the depth dimension, and wherein the first and second ends define respective first and second width dimensions extending transverse to the depth dimension, the first width dimension being unequal to the second width dimension such that the dovetail-like profile generally defines a wedge shape,
   with the areal extent of the recess being smaller than the maximum cross section of an outer contact.

2. The semiconductor device according to claim 1, wherein the recess in the outer contact connection surface comprises a circular edge.

3. The semiconductor device according to claim 1, wherein the recess in the outer contact connection surface comprises an oval edge.

4. The semiconductor device according to claim 1, wherein the recess in the outer contact connection surface comprises a square edge.

5. The semiconductor device according to claim 1, wherein the recess in the outer contact connection surface comprises a rectangular edge.

6. The semiconductor device as according to claim 1, wherein the recess in the outer contact connection surface comprises a polygonal edge.

7. The semiconductor device of claim 1, comprising wherein the outer contact connection surface comprises a plurality of recesses with dovetail-like profile, with the sum of the base areas of the recesses of an outer contact connection surface being smaller than the maximum cross-sectional area of the outer contact.

8. The semiconductor device according to claim 1, comprising wherein the recess has a depth t which is less than half the height h of the outer contact, with a range $h/10 \leq t < h/2$.

9. The semiconductor device according to claim 1, comprising wherein the outer contact connection surface comprises two metal layers; a first metal layer which comprises a first metal, and a second metal layer, which is arranged on the first metal layer and comprises a second metal, the recess being arranged in the second metal layer.

10. The semiconductor device according to claim 1, comprising wherein the outer contact connection surfaces are arranged on a wiring structure of a wiring substrate, the wiring substrate comprising a semiconductor chip which is electrically connected to the outer contact connection surfaces via connecting elements and is surrounded by a housing.

11. The semiconductor device according to claim 1, comprising wherein the outer contacts are solder balls or solder bumps which comprise a lead-free solder.

12. The semiconductor device according to claim 1, comprising wherein the outer contacts are solder balls or solder bumps, with brittle intermetallic phases of the solder material being formed predominantly in the region of the recesses in the outer contact connection surfaces.

13. A semiconductor device comprising:
a semiconductor device with surface-mountable outer contacts, the surface-mountable outer contacts being arranged on outer contact connection surfaces on an underside of the semiconductor device,
the outer contact connection surfaces having in their respective center region at least one recess which comprises a dovetail-like profile, wherein the recess defines a depth dimension with first and second ends at opposite ends of the depth dimension, and wherein the first and second ends define respective first and second width dimensions extending transverse to the depth dimension, the first width dimension being unequal to the second width dimension such that the dovetail-like profile generally defines a wedge shape,
with the areal extent of the recess being smaller than the maximum cross section of an outer contact, and
a printed circuit board having contact connection surfaces receiving the outer contacts.

14. The semiconductor device of claim 13, comprising wherein the outer contact connection surface comprises a plurality of recesses with dovetail-like profile, with the sum of the base areas of the recesses of an outer contact connection surface being smaller than the maximum cross-sectional area of the outer contact.

15. The semiconductor device according to claim 13, comprising wherein the recess has a depth t which is less than half the height h of the outer contact, with a range $h/10 \leq t < h/2$.

16. The semiconductor device according to claim 13, comprising wherein the outer contact connection surface comprises two metal layers; a first metal layer which comprises a first metal, and a second metal layer, which is arranged on the first metal layer and comprises a second metal, the recess being arranged in the second metal layer.

17. The semiconductor device according to claim 16, comprising wherein the outer contact connection surfaces are arranged on a wiring structure of a wiring substrate, the wiring substrate comprising a semiconductor chip which is electrically connected to the outer contact connection surfaces via connecting elements and is surrounded by a housing.

18. The semiconductor device according to claim 17, comprising wherein the outer contacts are solder balls or solder bumps, with brittle intermetallic phases of the solder material being formed predominantly in the region of the recesses in the outer contact connection surfaces.

19. The semiconductor device of claim 13, wherein the outer contacts include an intermetallic phase in a boundary zone, and wherein the boundary zone is received completely within the recess.

* * * * *